(12) United States Patent
Ahn et al.

(10) Patent No.: US 11,698,659 B2
(45) Date of Patent: Jul. 11, 2023

(54) INTEGRATED CIRCUIT AND OPERATING METHOD THEREOF

(71) Applicant: Samsung Electronics Co., Ltd., Suwon-si (KR)

(72) Inventors: Jieun Ahn, Seongnam-si (KR); Sungcheol Park, Seoul (KR); Kiseok Bae, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/559,255

(22) Filed: Dec. 22, 2021

(65) Prior Publication Data
US 2022/0269306 A1 Aug. 25, 2022

(30) Foreign Application Priority Data

Feb. 25, 2021 (KR) .......................... 10-2021-0025964

(51) Int. Cl.
| | |
|---|---|
| *H03K 3/00* | (2006.01) |
| *G06F 1/12* | (2006.01) |
| *H03K 3/037* | (2006.01) |
| *H03K 19/20* | (2006.01) |
| *G06F 1/06* | (2006.01) |
| *H03K 5/01* | (2006.01) |
| *H03K 5/00* | (2006.01) |

(52) U.S. Cl.
CPC ................. *G06F 1/12* (2013.01); *G06F 1/06* (2013.01); *H03K 3/037* (2013.01); *H03K 5/01* (2013.01); *H03K 19/20* (2013.01); *H03K 2005/00013* (2013.01)

(58) Field of Classification Search
CPC .. G06F 1/12; G06F 1/06; H03K 3/037; H03K 5/01; H03K 19/20; H03K 2005/00013; H03K 2005/00058; H03K 5/133; H03K 5/135; H03K 5/131; H03L 7/08
USPC ......................................................... 327/199
See application file for complete search history.

(56) References Cited

U.S. PATENT DOCUMENTS 5,793,227 A * 8/1998 Goldrian ............... H04L 7/0045
327/198
6,439,679 B1 8/2002 Roylance
(Continued)

FOREIGN PATENT DOCUMENTS

KR 10-1646506 B1 8/2016

OTHER PUBLICATIONS

Salomon Beer, Ran Ginosar, Rostislav (Reuven) Dobkin, Yoav Weizman. "MTBF Estimation in Coherent Clock Domains", 19th IEEE International Symposium, pp. 1-8 (2013).

*Primary Examiner* — Ryan Jager
(74) *Attorney, Agent, or Firm* — Harness, Dickey & Pierce, P.L.C.

(57) ABSTRACT

Provided is an integrated circuit. The integrated circuit includes a plurality of clock generators configured to respectively generate a plurality of clock signals, a plurality of logic circuits configured to operate in synchronization with the plurality of clock signals, and controller circuitry configured to identify meta-stability information based on frequencies of the plurality of clock signals, and configured to control at least one clock generator so that at least one of the plurality of clock signals is randomly delayed in response to the meta-stability information.

20 Claims, 16 Drawing Sheets

(56) References Cited

U.S. PATENT DOCUMENTS

| | | | |
|---|---|---|---|
| 6,708,284 B2 * | 3/2004 | Smith | G06F 11/1407 714/E11.061 |
| 6,904,553 B1 * | 6/2005 | Brown | G01R 31/318594 714/731 |
| 6,922,111 B2 | 7/2005 | Kurd et al. | |
| 7,027,545 B2 | 4/2006 | Sander | |
| 7,149,916 B1 * | 12/2006 | Marino | H04L 7/02 713/400 |
| 7,162,661 B2 * | 1/2007 | Mudge | G06F 1/3287 714/10 |
| 7,230,458 B2 | 6/2007 | DaDalt | |
| 7,382,824 B1 * | 6/2008 | Marmash | G06F 30/35 375/224 |
| 7,500,132 B1 * | 3/2009 | Pothireddy | G06F 5/06 713/400 |
| 8,060,814 B2 * | 11/2011 | Blaauw | G06F 11/0721 714/814 |
| 8,132,036 B2 * | 3/2012 | Pothireddy | H04L 7/0012 713/400 |
| 8,514,972 B2 | 8/2013 | Kang et al. | |
| 8,533,541 B2 * | 9/2013 | Iwashita | G06F 11/261 716/108 |
| 8,607,173 B2 * | 12/2013 | Sarwary | G06F 30/33 716/106 |
| 8,819,472 B1 * | 8/2014 | Muscha | G06F 1/12 713/400 |
| 9,223,916 B2 * | 12/2015 | DiLullo | G06F 30/3312 |
| 9,547,732 B2 | 1/2017 | Drasny et al. | |
| 9,825,636 B1 * | 11/2017 | Dodrill | H03L 7/00 |
| 10,331,410 B2 | 6/2019 | Wesson et al. | |
| 10,699,769 B2 | 6/2020 | Best et al. | |
| 2004/0225977 A1 * | 11/2004 | Akkerman | G06F 30/33 716/108 |
| 2006/0044022 A1 * | 3/2006 | Tayler | H03K 5/1534 327/24 |
| 2006/0277329 A1 * | 12/2006 | Paulson | H04L 7/00 710/39 |
| 2007/0064852 A1 * | 3/2007 | Jones | H04L 7/02 375/356 |
| 2015/0022252 A1 * | 1/2015 | Venas | H03K 3/037 327/225 |
| 2020/0292616 A1 | 9/2020 | Conklin et al. | |
| 2022/0255541 A1 * | 8/2022 | Zlotnik | G06F 1/24 |
| 2022/0269306 A1 * | 8/2022 | Ahn | G06F 1/12 |

\* cited by examiner

INTEGRATED CIRCUIT AND OPERATING METHOD THEREOF

CROSS-REFERENCE TO RELATED APPLICATION

This application is based on and claims priority under 35 U.S.C. § 119 to Korean Patent Application No. 10-2021-0025964, filed on Feb. 25, 2021 in the Korean Intellectual Property Office, the disclosure of which is incorporated by reference herein in its entirety.

BACKGROUND

Inventive concepts relate to an integrated circuit including a clock generator, and more particularly, to an integrated circuit controlling a clock signal to reduce meta-stability, and/or an operating method of the integrated circuit.

Semiconductor devices included in a computer system may operate in synchronization with a clock signal, and various signals may be transmitted and received in synchronization with the clock signal in the same clock domain circuit inside the semiconductor devices or between one clock domain and another clock domain.

At the time of designing the integrated circuit, because clocks of various frequencies are used by utilizing various clock sources and/or clock dividers, and the number of asynchronized clocks in the integrated circuit increases, an issue of a clock domain crossing (CDC) at the time of data transmission between asynchronized clock domains has become gradually complicated.

In this case, when data is transmitted between asynchronized clock domains, an issue of meta-stability may occur, and accordingly, various methods of reducing the probability that the meta-stability occurs are applied.

SUMMARY

Inventive concepts provide a clock control method of reducing meta-stability.

According to some example embodiments of inventive concepts, there is provided an integrated circuit including a plurality of clock generators configured to respectively generate a plurality of clock signals, a plurality of logic circuits configured to operate in synchronization with the plurality of clock signals, and controller circuitry configured to identify meta-stability information based on frequencies of the plurality of clock signals, and configured to control at least one of the plurality of clock generators so that the at least one of the plurality of clock signals is randomly delayed in response to the meta-stability information.

According to some example embodiments of inventive concepts, there is provided a method performed by an integrated circuit including a plurality of clock generators, the method including identifying a first clock signal and a second clock signal, the first clock signal and the second clock signal causing meta-stability based on frequencies of a plurality of clock signals generated by the plurality of clock generators, delaying randomly at least one of the first clock signal and the second clock signal, and providing the first clock signal to a first logic circuit and the second clock signal to a second logic circuit. The first logic circuit communicates with the second logic circuit in synchronization with the first clock signal, and the second logic circuit communicates with the first logic circuit in synchronization with the second clock signal.

According to some example embodiments of inventive concepts, there is provided a method performed by an integrated circuit including a plurality of clock generators, the method including identifying a clock generator causing meta-stability in logic circuits that communicate with each other, the identifying based on frequencies of clock signals of each of a plurality of clock generators, selecting at least one clock generator, which randomly delays a clock signal, of the identified clock generators, and providing a random delay to the logic circuit via the selected at least one clock generator.

BRIEF DESCRIPTION OF THE DRAWINGS

Some example embodiments of inventive concepts will be more clearly understood from the following detailed description taken in conjunction with the accompanying drawings in which.

DETAILED DESCRIPTION OF EXAMPLE EMBODIMENTS

Figure 1:
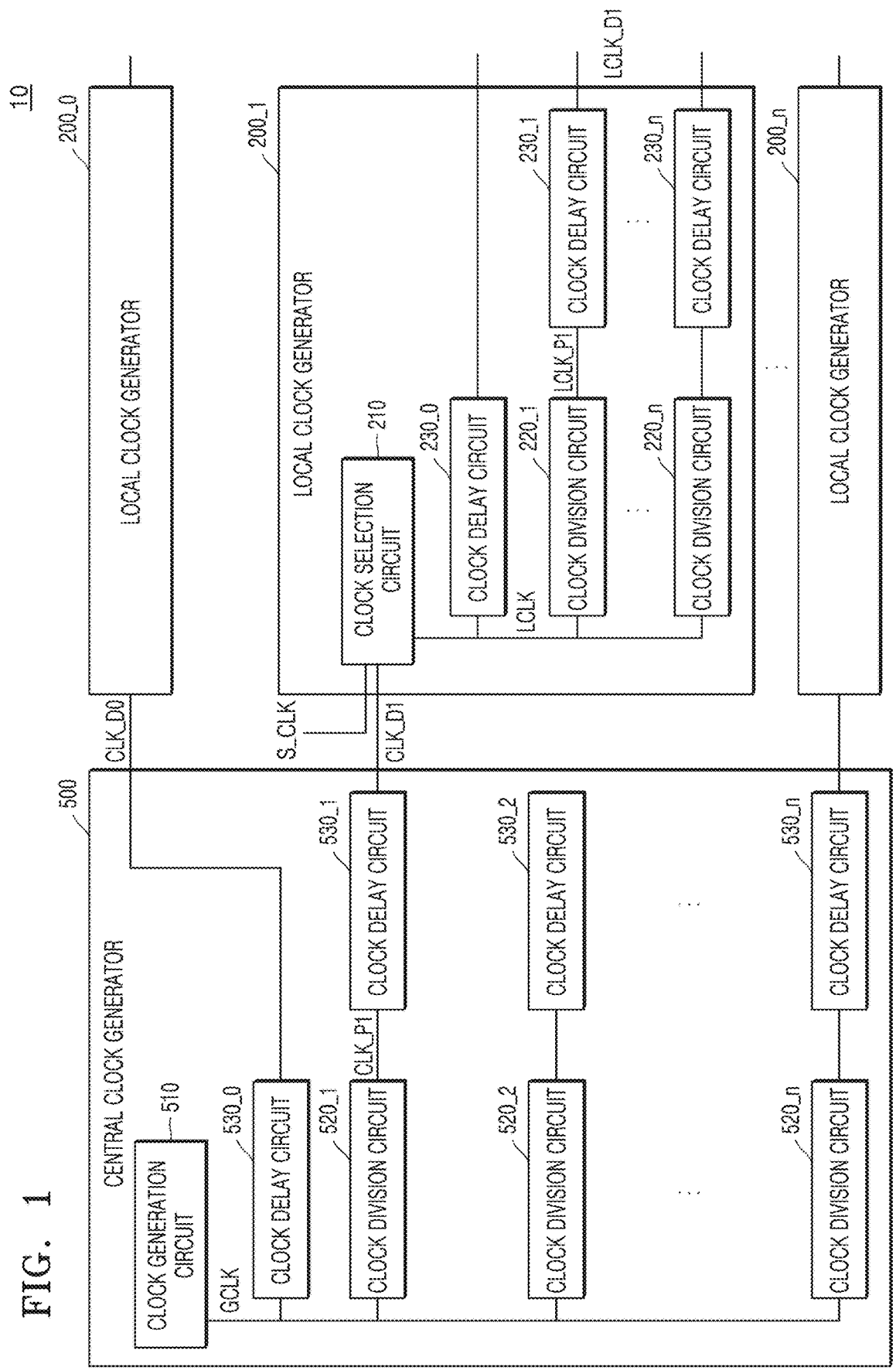
FIG. 1 is a block diagram of a configuration of an integrated circuit, according to some example embodiments.

FIG. 1 is a block diagram of a configuration of an integrated circuit 10, according to some example embodiments.

Referring to FIG. 1, the integrated circuit 10 may include a central clock generator 500 and a plurality of local clock generators 200_0, 200_1, . . . , and 200_n.

The central clock generator 500 may include a clock generating circuit 510, a plurality of clock division circuits 520_1, 520_2, . . . , and 520_n, and a plurality of clock delay circuits 530_0, 530_1, . . . , and 530_n.

The clock generation circuit 510 may include a phase-locked loop (PLL) circuit. The PLL circuit may include a circuitry and/or a system controlling an output signal by using a phase difference between signals provided as feedback from an input signal and an output signal, and may adjust a frequency of the output signal based on the input signal. The PLL circuit may fix a phase of a clock signal, and/or may adjust an input/output (I/O) ratio of a clock. The clock generation circuit 510 may output a central clock signal GCLK.

The clock division circuits 520_1, 520_2, ..., and 520_n may include frequency distributors and/or frequency dividers. For example, the clock division circuit 520_1 may receive the central clock signal GCLK, and may generate a divided clock signal CLK_P1 having a frequency of 1/N (where N is a positive integer) times the frequency of the central clock signal GCLK. Each of the clock delay circuits 530_0, 530_1, ..., and 530_n may receive the divided clock signal CLK_P1, and may provide a delayed clock signal CLK_D1 in which a random delay or a set delay has been applied to the divided clock signal CLK_P1. Each of the clock delay circuits 530_0, 530_1, ..., 530_n may have the same design, or at least one of the clock delay circuits 530_0, 530_1, ..., 530_n may have a design different from others of the clock delay circuits 530_0, 530_1, ..., 530_n.

Each of the local clock generators 200_1, 200_2, ..., and 200_n may generate clock signals of various frequencies by using a source clock as an input, and may provide the generated clock signals to logic circuits. Each of the local clock generators 200_1, 200_2, ..., and 200_n may include a clock selection circuit 210, a clock division circuit 220_1, ..., 220_n, and a clock delay circuit 230_1, ..., 230_n. The clock selection circuit 210 may include a multiplexer, and may select one of a plurality of source clocks, e.g. based on the multiplexer. Each of the local clock generators 200_1, 200_2, ..., 200_n may have the same design, or at least one of the local clock generators 200_1, 200_2, ..., 200_n may have a design different from others of the local clock generators 200_1, 200_2, ..., 200_n. The clock division circuit 220 may include a frequency distributor and/or a frequency divider. The clock division circuit 220 may receive the source clock from the clock selection circuit 210, and generate a clock signal in which the source clock has been divided. The clock delay circuit 230 may receive the source clock from the clock selection circuit 210, and may generate a clock signal in which a random delay and/or a set delay has been applied to the source clock. A configuration of the clock delay circuit 230 will be described in detail with reference to FIG. 4.

The clock generating circuit 510 may generate the central clock signal GCLK, and may provide the central clock signal GCLK to, e.g. directly to the clock delay circuit 530_0. The clock delay circuit 530_0 may generate a delayed clock signal CLK_D0 by delaying the central clock signal GCLK. The clock generation circuit 510 may provide the central clock signal GCLK to the clock division circuit 520_1, and the clock division circuit 520_1 may generate the divided clock signal CLK_P1 by dividing the central clock signal GCLK. The clock division circuit 520_1 may provide the divided clock signal CLK_P1 to the clock delay circuit 530_1, and the clock delay circuit 530_1 may generate a delayed clock signal CLK_D1 by delaying the divided clock signal CLK_P1. The local clock generator 200_1 may provide, to the clock selection circuit 210, exactly one or at least one of the clock signals provided by the central clock generator 500. The clock selection circuit 210 may select as a local clock signal LCLK one of the plurality of clock signals provided by the PLL circuit and/or a clock oscillator, and provide the selected one to a plurality of clock division circuits 220_1 through 220_n. The clock division circuit 220_1 may receive the local clock signal LCLK, and generate a divided local LCLK_P1 by dividing the local clock signal LCLK. The clock division circuit 220_1 may provide the divided local clock signal LCLK_P1 to the clock delay circuit 230_1. The clock delay circuit 230_1 may provide a delayed local clock signal LCLK_D1 to a synchronized logic circuit.

The logic circuit may include flip-flops, such as D flip-flops, synchronized with the clock signals generated by the local clock generators 200_1, 200_2, ..., and 200_n. The flip-flop may be included in various electronic circuits, integrated circuits, chips, and/or various devices, which process digital signals.

The integrated circuit 10 may further include the central clock generator 500, the plurality of local clock generators 200_1, 200_2, ..., and 200_n, and a processor connected to the plurality of logic circuits or a memory module connected to the processor and storing various pieces of information. In some example embodiments, the integrated circuit 10 may be integrated in one semiconductor chip. In some example embodiments, the memory module may include one or more memory chips. Alternatively or additionally in some example embodiments, the processor may include multi-processing chips.

In some example embodiments, the processor may include a central processing unit (CPU), which is a general purpose processor. In some example embodiments, the processor may further include, in addition to or alternatively to the CPU, a micro-controller, a digital signal processor (DSP), a graphics processing unit (GPU), a dedicated application specific integrated circuit (ASIC), etc. In addition or alternatively, the processor may include one or more CPUs which operate in a distributed processing environment. In some example embodiments, the processor may include a system on chip (SoC) having functions in addition to functions of the CPU.

The memory module may include, for example, dynamic random-access memory (RAM) (DRAM) such as synchronous DRAM (SDRAM), and/or a DRAM-based three-dimensional (3D) stack (3DS) memory module such as a high bandwidth memory (HBM) module and/or a hybrid memory cube (HMC) memory module. The memory module may include a semiconductor-based storage such as at least one of a solid state drive (SSD), a DRAM module, static RAM (SRAM), phase-change RAM (PRAM), resistive RAM (RRAM), conductive-bridging RAM (CBRAM), magnetic RAM (MRAM), and spin-transfer torque MRAM (STT-MRAM).

Controller circuitry, e.g. a controller, may be configured to control all operations of the central clock generator 500, the plurality of local clock generators 200_1, 200_2, ..., and 200_n, and the plurality of logic circuits, and to this end, may be configured to drive firmware and/or software loaded in an operation memory device.

A clock structure of the integrated circuit 10 may include a plurality of clock lines including PLL circuits such as identical PLL circuits. The integrated circuit 10 may divide and provide a clock per block via the central clock generator 500, and divide and provide the clock to each of devices in blocks via the local clock generators 200_1, 200_2, ..., and 200_n. Each clock may be designed in a synchronized structure or an asynchronized structure, and for example, clocks provided to each block may be designed to be asynchronized, and the clocks in the blocks may be designed in a globally asynchronous, locally synchronous (GALS) manner in which the clocks are synchronized with each other. In FIG. 1, only local clock generators 200_1, 200_2, ..., and 200_n are illustrated, but each of the local clock generators 200_1, 200_2, ..., and 200_n may be linked with other devices and constitute a block domain or a local clock domain.

Figure 2A:
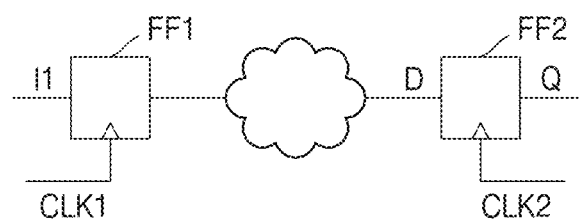
FIGS. 2A and 2B are diagrams describing an issue of meta-stability between asynchronized clocks in an integrated circuit, according to example embodiments.
Figure 2B:
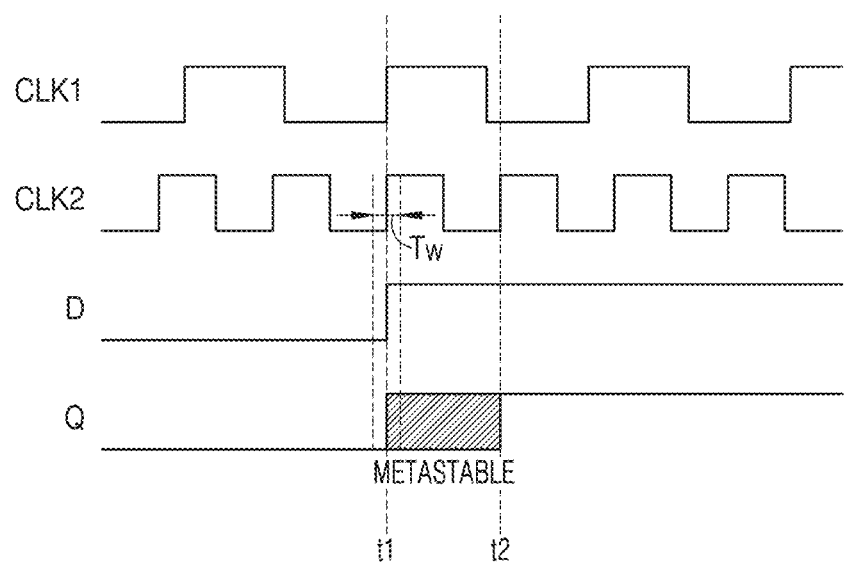

FIGS. 2A and 2B are diagrams describing an issue of meta-stability between asynchronized clocks in the integrated circuit, according to example embodiments.

Referring to FIG. 2A, flip-flops FF1 and FF2 may include at least one of input switching circuits, latch circuits, and clock inverter circuits. The flip-flops FF1 and FF2 may be included in various electronic circuits, integrated circuits, chips, and various devices, which process digital signals.

The flip-flops FF1 and FF2 may be triggered at rising edges of first and second clock signals CLK1 and CLK2. For example, the flip-flops FF1 and FF2 may output an input signal D latched at the rising edges of the first and second clock signals CLK1 and CLK2 as an output signal Q. A flip-flop may be implemented as a one-bit flip-flop, or as a multi-bit flip-flop of more than two bits. The flip-flops FF1 and FF2 may have a set function of setting the output signal Q to a first logic level (for example, '1'), and/or may have a reset function of resetting the output signal Q to a second logic level (for example, '0'). In some example embodiments, the flip-flops FF1 and FF2 may perform a retention function for maintaining data. In addition, the flip-flops FF1 and FF2 output the input signal D latched at the rising edges of the first and second clock signals CLK1 and CLK2 as the output signal Q, but example embodiments are not limited thereto, and according to some example embodiments, the flip-flops FF1 and FF2 may also output, as the output signal Q, the input signal D latched at falling edges of the first and second clock signals CLK1 and CLK2, for example, at the rising edges of reversed clock signals.

When data communication is performed between the asynchronized clock domains, as illustrated in FIGS. 2A and 2B, an issue of meta-stability may occur in the flip-flop FF2. When the input signal D of the flip-flop FF2 is state-transferred in a setup/hold timing window Tw of the second clock signal CLK2 input to the flip-flop FF2, the output signal Q of the flip-flop FF2 may have an unstable value (e.g. may be 0 or 1 or an intermediate value, for example may be a random value) during one frequency (for example, an interval from a time point t1 to a time point t2). This state may be referred to as an unstable state in which the state is 0 or 1 is not known, that is, the state is meta-stable.

Figure 3A:
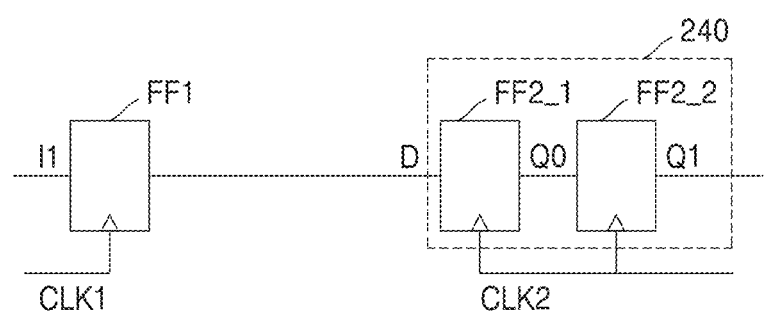
FIGS. 3A and 3B are diagrams of a synchronization circuit for reducing meta-stability included in an integrated circuit, according to some example embodiments.
Figure 3B:
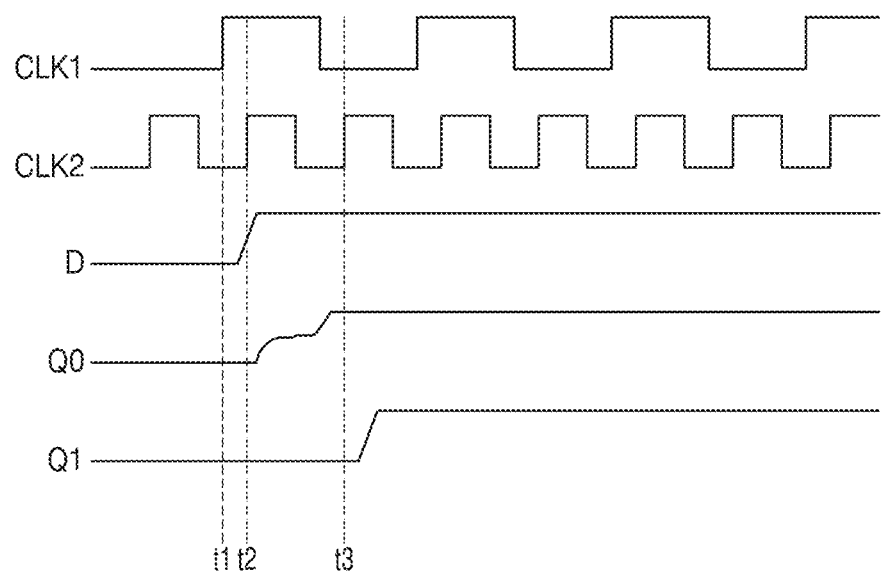

FIGS. 3A and 3B are diagrams of a synchronization circuit for reducing meta-stability included in the integrated circuit 10, according to some example embodiments.

When an integrated circuit is designed, to avoid or minimize or reduce the likelihood of and/or impact of meta-stability, a synchronizer of a certain depth, e.g. a preset depth N. may be added in a data path where the meta-stability occurs. When the preset depth N of the synchronizer increases, the probability of the meta-stability being transferred to the last flip-flop may be reduced.

The integrated circuit 10 may include a synchronizer 240. The synchronizer 240 may constitute or be included in a sequential circuit. For example, the synchronizer 240 may include a first flip-flop FF2_1 and a second flip-flop FF2_2. The first flip-flop FF2_1 may receive the input signal D, and may output a first output signal Q0 by latching the input signal D based on the second clock signal CLK2. The second flip-flop FF2_2 may receive the first output signal Q0, and may provide a second output signal Q1 as an output by latching the first output signal Q0 based on the second clock signal CLK2.

The synchronizer 240 may be used to reduce the probability of and/or impact of meta-stability in the data communication between the asynchronized clock domains, and/or to increase an average of a no-malfunction time. The synchronizer 240 may simply delay an input signal of another clock domain, by using a multi-edge sensing flip-flop using clocks in the same clock domain.

Referring to FIG. 3B, the time point t2 at which the first output signal Q0 of the first flip-flop FF2_1 is set overlaps a time period (from the time point t1 to the time point t2) in which the input signal D input to the first flip-flop FF2_1 is transitioned from 0 to 1 in the synchronizer 240, and thus, the first output signal Q0 of the first flip-flop FF2_1 may be meta-stable from the time point t2 to a time point t3. However, the second flip-flop FF2_2 may be sequentially connected to an output of the first flip-flop FF2_1, and may latch the second output signal Q1 based on a level of the first output signal Q0 before the time point t2 at which the first output signal Q0 is transitioned. Accordingly, the second flip-flop FF2_2 may output the second output signal Q1, which is stable but not meta-stable, during a time period (from the time point t2 to the time point t3) in which the first flip-flop FF2_1 maintains the meta-stability.

The synchronizer 240 according to inventive concepts uses two flip-flops, but the embodiment is not limited thereto, and may use three or more flip-flops, and/or various elements such as a latch in addition to the flip-flops.

Figure 4:
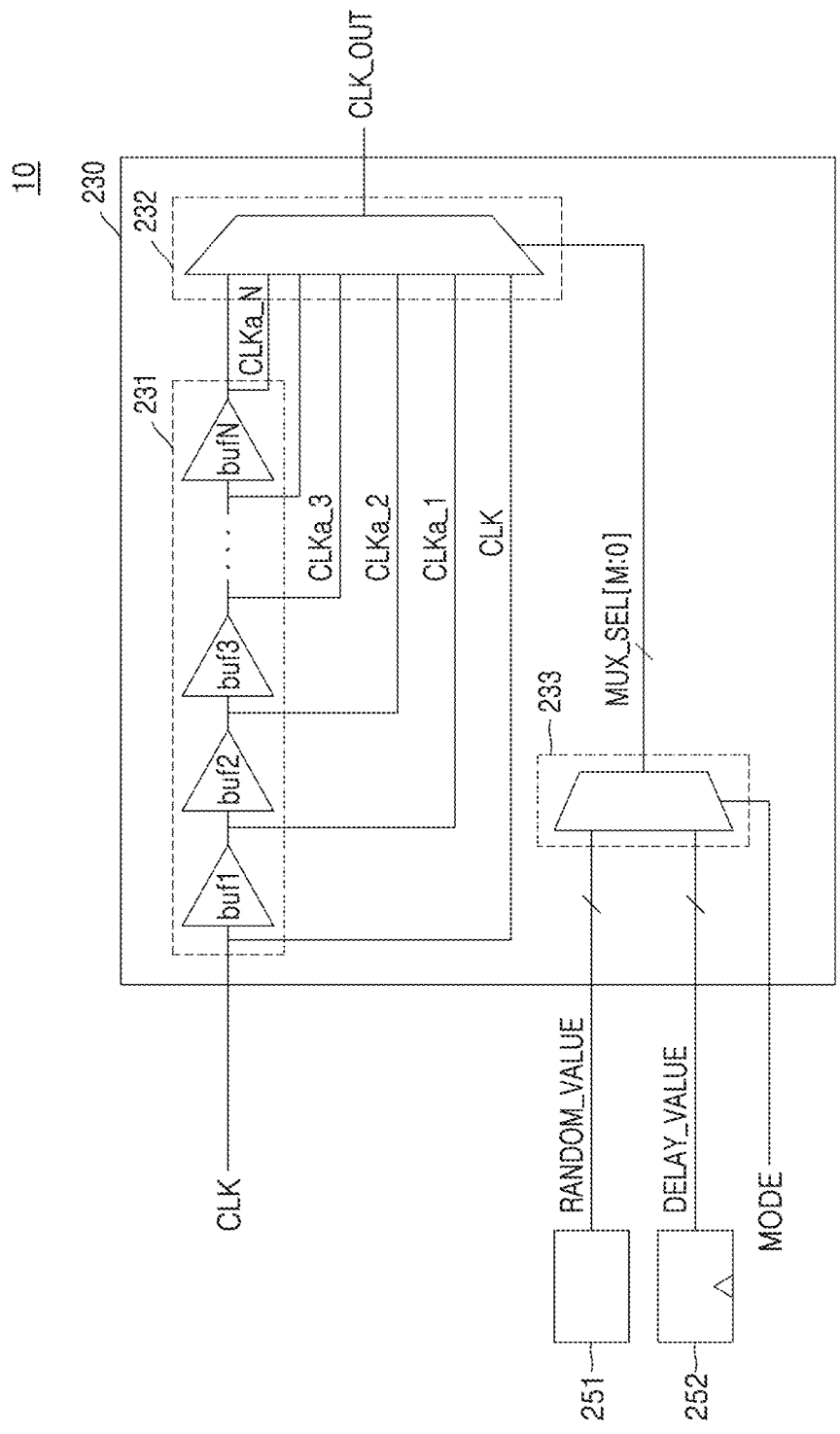
FIG. 4 is a diagram of a clock delay circuit included in an integrated circuit, according to some example embodiments.

FIG. 4 is a diagram of a clock delay circuit 230 included in the integrated circuit 10, according to some example embodiments.

Referring to FIG. 4, the clock delay circuit 230 may include a delay buffer chain 231, a delay select multiplexer 232, and a mode select multiplexer 233. The clock delay circuit 230 may provide an output clock signal CLK_OUT that has been delayed based on an input clock signal CLK. The delay buffer chain 231 may include a plurality of delay buffers buf1, buf2, . . . , and bufN.

The delay select multiplexer 232 may receive, from the delay buffer chain 231, a plurality of delayed clock signals CLK, CLKa_1, CLKa_2, . . . , and CLKa_N, and may select one of the plurality of delay clock signals as the output clock signal CLK_OUT according to a delay select signal MUX_SEL[M:0]. The delay select signal MUX_SEL[M:0] may have a random value RANDOM_VALUE and/or a set value DELAY_VALUE.

The mode select multiplexer 233 may select one of the random value RANDOM_VALUE or the set value DELAY_VALUE as the delay select signal MUX_SEL[M:0] according to the operation mode signal MODE. For example, in a normal operation of the integrated circuit 10, the clock delay circuit 230 may operate in a random mode. Accordingly, the operation mode signal MODE may represent or correspond to the random mode, and the mode select multiplexer 233 may select the random value RANDOM_VALUE as the delay select signal MUX_SEL[M:0]. When the integrated circuit performs a debugging operation, the clock delay circuit 230 may operate in a debug mode. Accordingly, the operation mode signal MODE may represent the debug mode, and the mode select multiplexer 233 may select the set value DELAY_VALUE as the delay select signal MUX_SEL[M:0]. The delay select multiplexer 232 and the mode select multiplexer 233 may be referred to as muxes, scan muxes, and/or selectors.

The clock delay circuit 230 may operate in connection with a random number generator 251 generating a random value or a register 252 providing a delay value set at the time of debugging, and may also include the random number generator 251 and/or the register 252 inside the clock delay circuit 230.

Figure 5A:
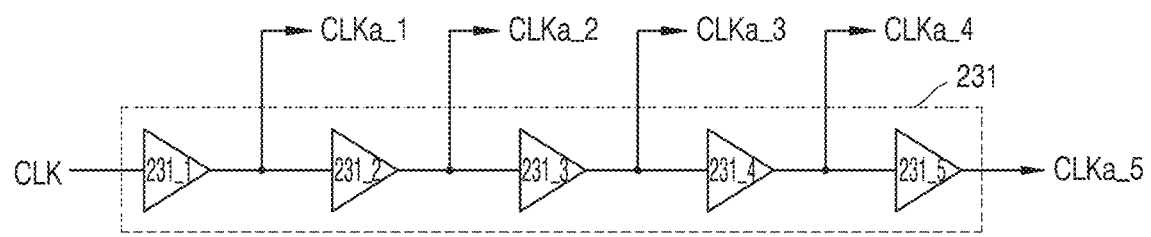
FIGS. 5A and 5B are diagrams describing a delay buffer chain included in an integrated circuit and delayed clock signals, according to example embodiment.
Figure 5B:
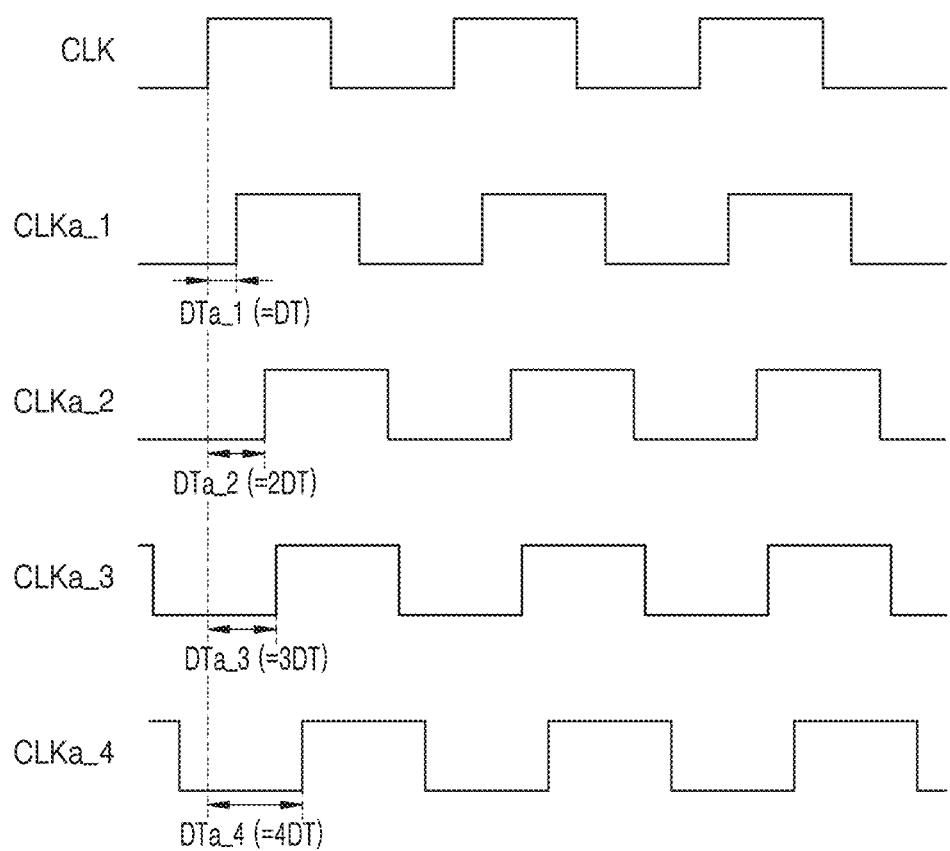

FIGS. 5A and 5B are diagrams describing a delay buffer chain included in an integrated circuit and delayed clock signals, according to example embodiment.

Referring to FIG. 5A, the delay buffer chain 231 may include a buffer chain including a plurality of buffers 231_1, 231_2, 231_3, 231_4, and 231_5 connected to each other in series. The clock delay circuit 231 may receive the input clock signal CLK, and output first through fifth delayed clock signals CLKa_1 through CLKa_5. The first through fourth delayed clock signals CLKa_1 through CLKa_4 may be respectively output from different nodes between one buffer and another buffer adjacent thereto included in the delay buffer chain 231. Each of the first through fourth delayed clock signals CLKa_1 through CLKa_4 may have a greater phase delay time when being transferred via more buffers. In some example embodiments, the phase difference of the first through fifth delayed clock signals CLKa_1 through CLKa_5 output by the delay buffer chain 231 may not exceed about 360 degrees. Although five buffers 231_1, 231_2, 231_3, 231_4, and 231_5 are illustrated, example embodiments are not limited thereto, and there may be more or less than five buffers.

Referring to FIGS. 5A and 5B, the first through fifth delayed clock signals CLKa_1 through CLKa_5 output by the clock delay circuit 230 may gradually have a longer delay time, and the phase difference thereof from a reference delay clock signal CLK may be gradually increased. For example, when a first delay time DTa_1 has a value of DT, a second delay time DTa_2 may have a value of 2×DT, a third delay time DTa_3 may have a value of 3×DT, and a fourth delay time DTa_4 may have a value of 4×DT. However, this is an example for convenience of explanation, and inventive concepts are not limited to the second through fourth delay times DTa_2 through DTa_4 being multiples of the first delay time DTa_1. Magnitudes of the first through fourth delay times DTa_1 through DTa_4 may vary depending on a circuit configuration of the nodes and the first delay circuit from which each of the first through fourth delayed clock signals CLKa_1 through CLKa_4 is output.

Figure 6:
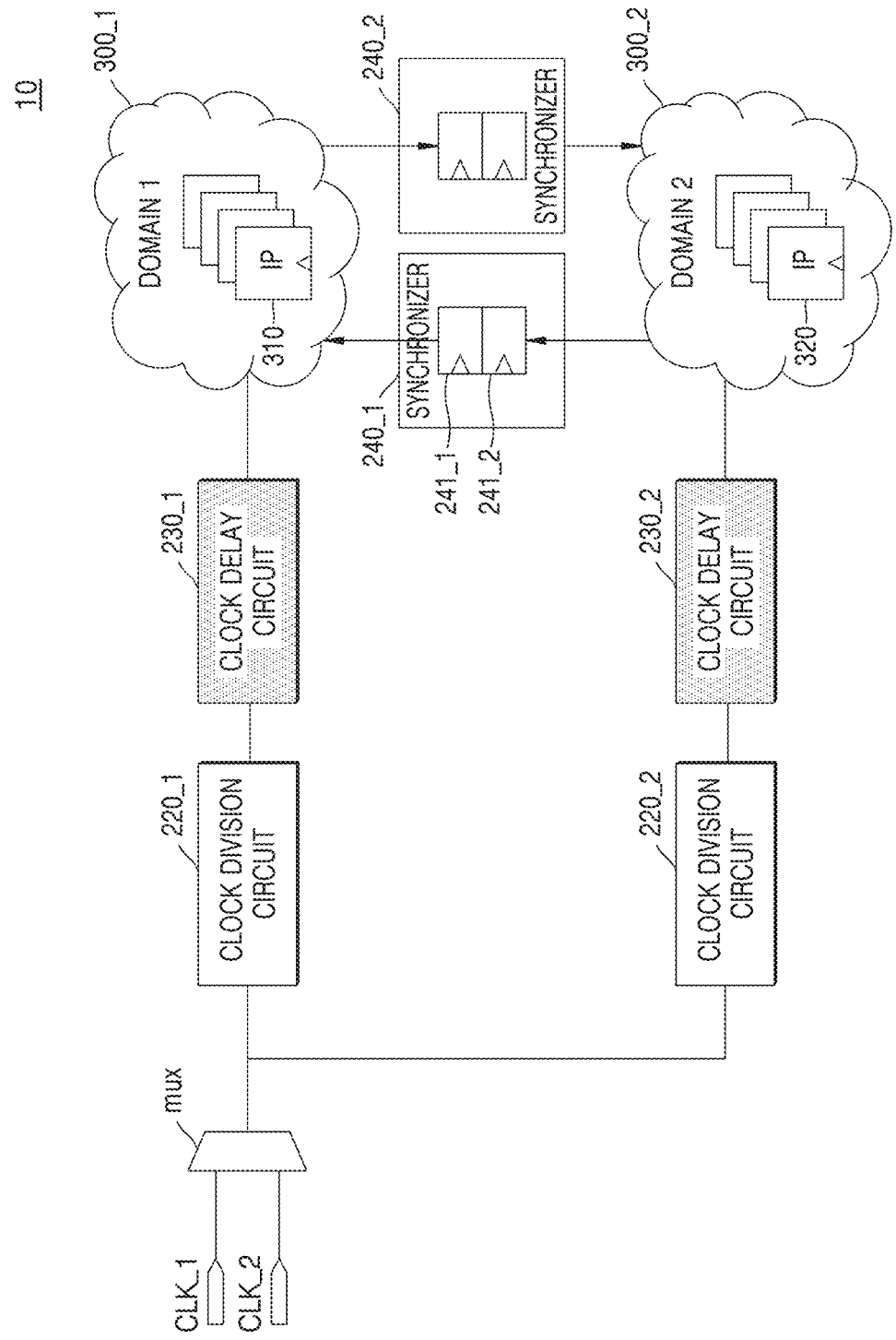
FIG. 6 is a block diagram of a configuration of an integrated circuit, according to some example embodiments.

FIG. 6 is a block diagram of a configuration of the integrated circuit 10, according to some example embodiments.

Referring to FIG. 6, the integrated circuit 10 may include a multiplexer mux, the clock division circuits 220_1 and 220_2, the clock delay circuits 230_1 and 230_2, a first domain 300_1, and a second domain 300_2. The integrated circuit 10 may provide a clock signal to the first domain 300_1 by using the clock division circuit 220_1 and the clock delay circuit 230_1 based on the source clock. The integrated circuit 10 may provide a clock signal to the second domain 300_2 by using the clock division circuit 220_2 and the clock delay circuit 230_2 based on the source clock. In this case, the multiplexer mux may select one of the first clock signal CLK_1 or the second clock signal CLK_2 as the source clock. For example, the first clock signal CLK_1 may be a clock signal generated by using the PLL circuit, and the second clock signal CLK_2 may be a clock signal generated by using the clock oscillator.

According to some example embodiments, the integrated circuit 10 may further include a second synchronizer 240_2 on a data line transferred from the first domain 300_1 to the second domain 300_2, and the probability that meta-stability occurs may be reduced by further including a first synchronizer 240_1 to the data line transferred from the second domain 300_2 to the first domain 300_1.

For example, when a frequency ratio of a clock signal is 1:1 or 1:N, and a clock domain using the same clock source is considered, the issue of meta-stability may more frequently occur than the asynchronized clock domain. Accordingly, the integrated circuit 10 may further include the clock delay circuits 230_1 and 230_2 for randomly delaying the clock signals in addition to a method of adding the first and second synchronizers 240_1 and 240_2 to the data line for solving the issue of meta-stability.

Figure 7A:
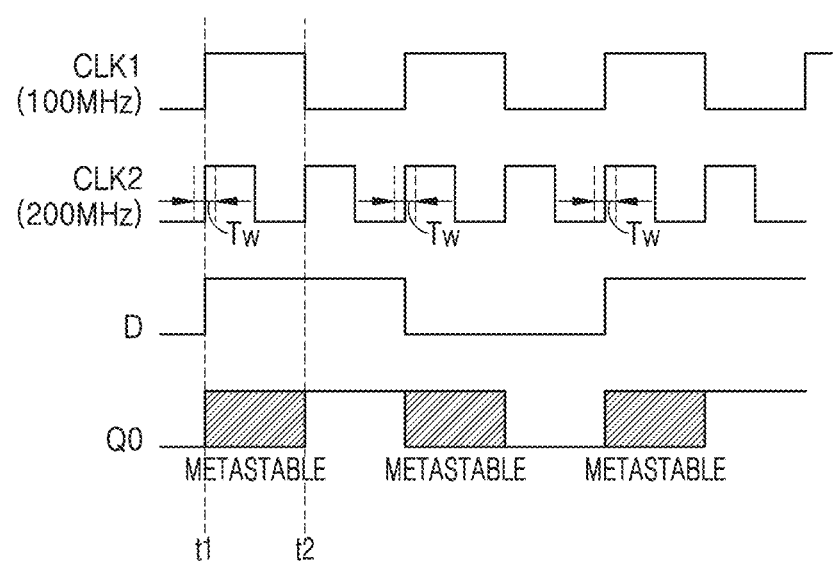
FIGS. 7A and 7B are diagrams describing meta-stability occurring in an integrated circuit, according to some example embodiments.
Figure 7B:
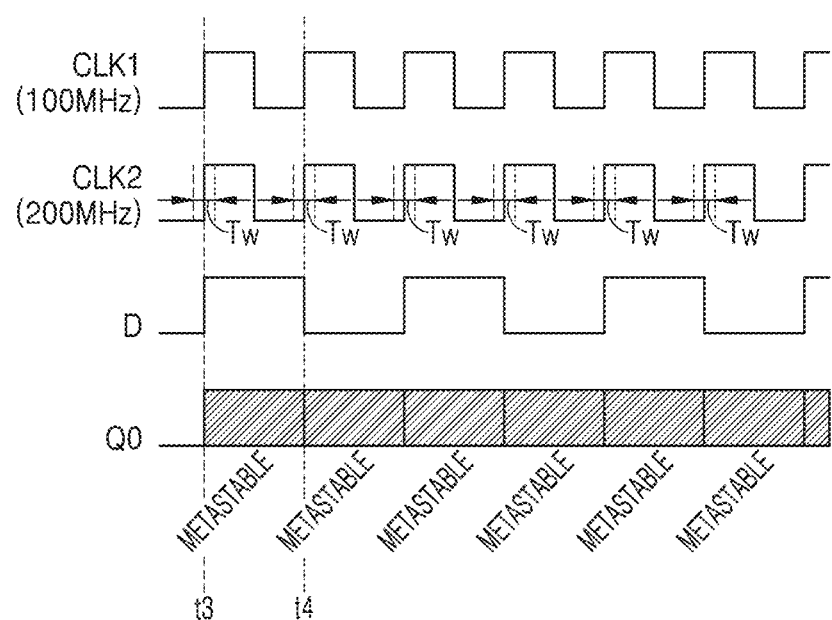

FIGS. 7A and 7B are diagrams describing the meta-stability occurring in an integrated circuit, according to some example embodiments.

A probability, P, of entering the meta-stability may be obtained based on a value Tw/Tc in which the setup/hold timing window Tw is divided by an object clock period Tc. For example, referring back to FIG. 3B, a frequency of the first clock signal CLK1 may be about 200 MHz, and a frequency of the second clock signal CLK2 may be about 333 MHz. The meta-stability may randomly occur between the first clock signal CLK1 of a frequency of about 200 MHz and the second clock signal CLK2 of a frequency of about 333 MHz, where the clock phase differences are not uniform. When the input signal D of the second flip-flop FF2 is transitioned in the setup/hold timing window Tw of the second clock signal CLK2, the meta-stability may occur. Because the phase difference of the first clock signal CLK1 and the second clock signal CLK2 is uniformly distributed between 0 and Tc, the meta-stability may occur randomly only when the phase difference between the first clock signal CLK1 and the second clock signal CLK2 is small.

When the frequency of the first clock signal CLK1 is the same as or an integer multiple of the frequency of the second clock signal CLK2, the probability that meta-stability occurs may be further increased. Because a clock signal phase difference distribution is not uniform in a coherent clock relationship sharing the clock source, the probability that meta-stability occurs may be increased.

Referring to FIGS. 2A and 7A, the frequency of the first clock signal CLK1 may be about 100 MHz, and the frequency of the second clock signal CLK2 may be about 200 MHz. The input signal D of the first flip-flop FF1 may be transitioned from 0 to 1 at the time point t1, and because the setup/hold timing window Tw of the first output signal Q0 of the first flip-flop FF1 includes the time point t1, the meta-stability may occur at the time point t1. The input signal D of the first flip-flop FF1 maintains 1 in a next period, e.g. from the time point t2, and thus, the meta-stability of the first output signal Q0 of the first flip-flop FF1 may be temporarily removed or reduced in likelihood of occurrence. The meta-stability of the first output signal Q0 may periodically occur according to relations of clock signals, and for example, the occurrence and disappearance of the meta-stability may be repeated once every two cycles.

When the frequency of the first clock signal CLK1 is about 200 MHz, and the frequency of the second clock signal CLK2 is about 200 MHz, referring to FIG. 7B, because the input signal D of the first flip-flop FF1 is transitioned from 0 to 1 at the time point t3, and the setup/hold timing window Tw of the first output signal Q0 of the first flip-flop FF1 includes the time point t3, the meta-stability may occur at the time point t3. The meta-stability of the first output signal Q0 may periodically occur according to relations of the clock signals, and for example, the occurrence and disappearance of the meta-stability may be repeated once every cycle.

For example, when a ratio of the frequency of the first clock signal CLK1 over the frequency of the second clock signal CLK2 is 1:N, the meta-stability may repeatedly occur once every N cycles, and an increase in the average no-malfunction time may occur. When the ratio of the frequency of the first clock signal CLK1 over the frequency of the second clock signal CLK2 is not 1:N, the meta-stability may randomly occur (e.g. a non-coherent case).

In a case of FIG. 7B, the state of the input signal D of the first flip-flop FF1 may be transitioned every cycle, and accordingly, the meta-stability may occur once in all cycles. For example, when the ratio of the frequency of the first clock signal CLK1 over the frequency of the second clock signal CLK2 is 1:1, the meta-stability may repeatedly occur once in all cycles, and the issue of the average no-malfunction time may occur. In this case, the probability that meta-stability occurs may be increased from Tw/Tc to 1, and an increase in average no-malfunction time may occur.

When the ratio of a clock frequency ratio is 1:1 or 1:N, the probability that meta-stability occurs may not be Tw/Tc, but may be 1 or may be 1/N. For example, because the meta-stability occurs once in all cycles in FIG. 7B, and the meta-stability occurs once every N cycles in FIG. 7A, the average no-malfunction time may be worse than that of the case in which the clock frequency ratio is neither 1:1 nor 1:N.

FIGS. 8A through 8D are diagrams describing the probability the meta-stability occurs at times of applying the random delay in an integrated circuit, according to example embodiments.

Referring to FIGS. 8A through 8D, the frequency of the first clock signal CLK1 may be about 100 MHz, and the frequency of the second clock signal CLK2 may be about 200 MHz.

Figure 8A:
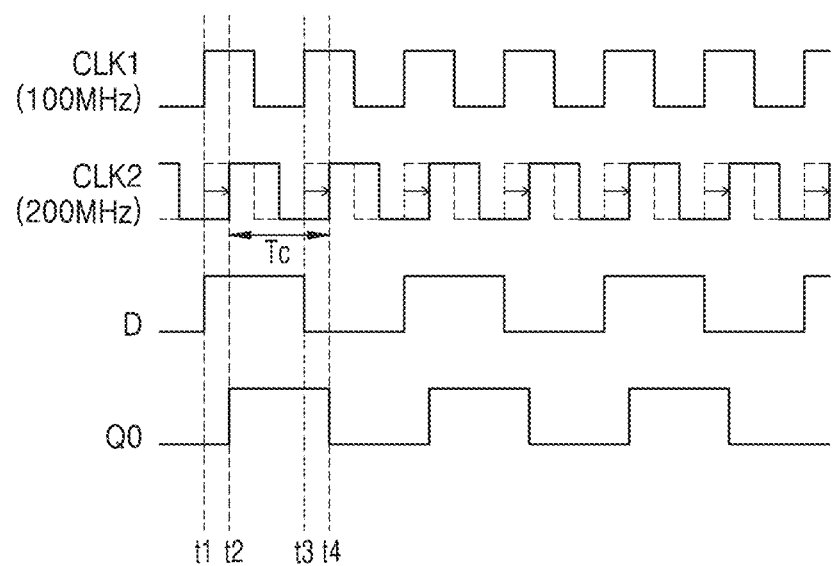
FIGS. 8A through 8D are diagrams describing the probability that meta-stability occurs at times of applying a random delay in an integrated circuit, according to some example embodiments.
Figure 8B:
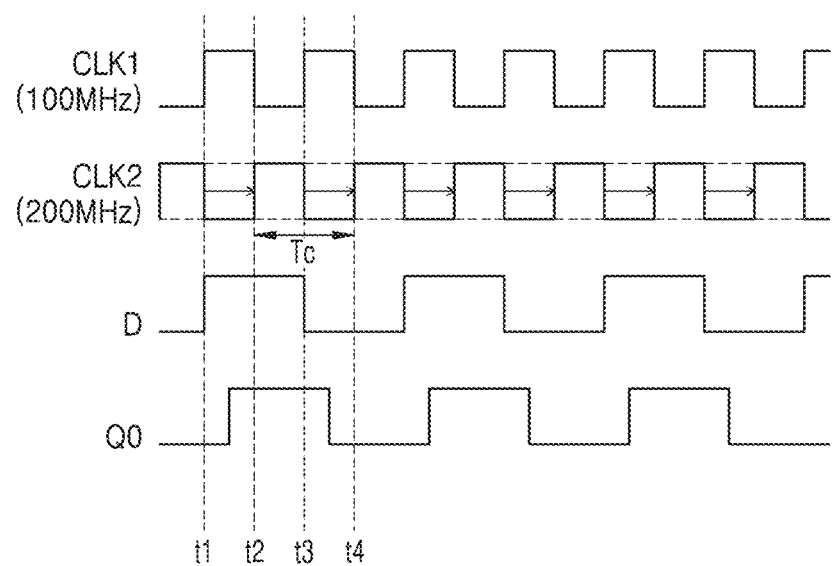
Figure 8C:
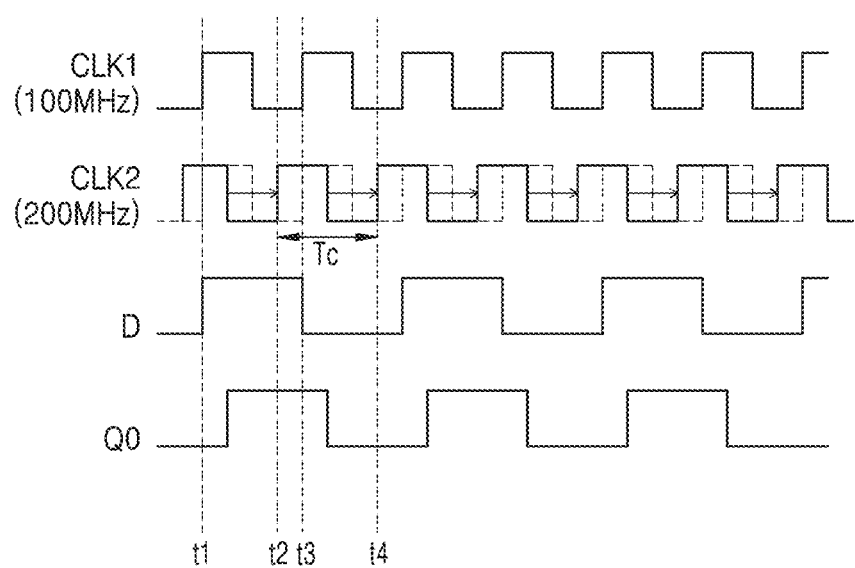
Figure 8D:
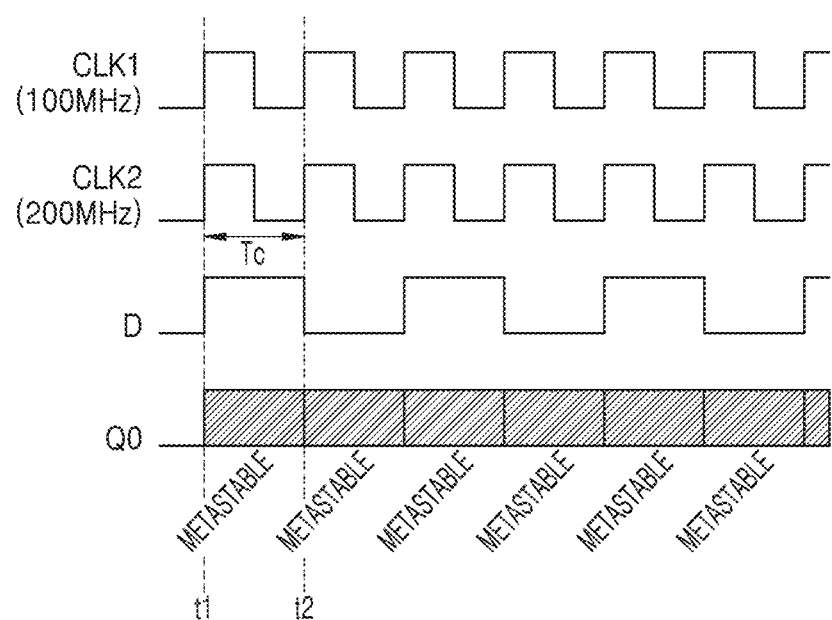

Because when a random delay is applied to the clock signal line, the clock signal phase difference distribution widens, an average no-malfunction time, which results when the meta-stability occurs at all clock edges or every N cycles, may be improved. When three delay buffers generating a delay time corresponding to ¼ of the clock period Tc are used, as illustrated in each of FIGS. 8A through 8D, the clock signal phase differences may be distributed to four cases, such as T0+Tc*(¼), T0+Tc*(2/4), T0+Tc*(¾), and T0 (here T0 is the original clock signal phase before using delay buffers). As illustrated in FIG. 8D, when the clock signal phase difference is T0, the meta-stability may occur in all cycles. However, when the clock delay is moved to Tc*(¼), Tc*(2/4), and Tc*(¾), the meta-stability may not occur. When the clock delay circuit including a delay buffer circuit is used, the probability that meta-stability occurs may be reduced to ¼, and the average no-malfunction time may be increased by a factor of four.

Figure 9:
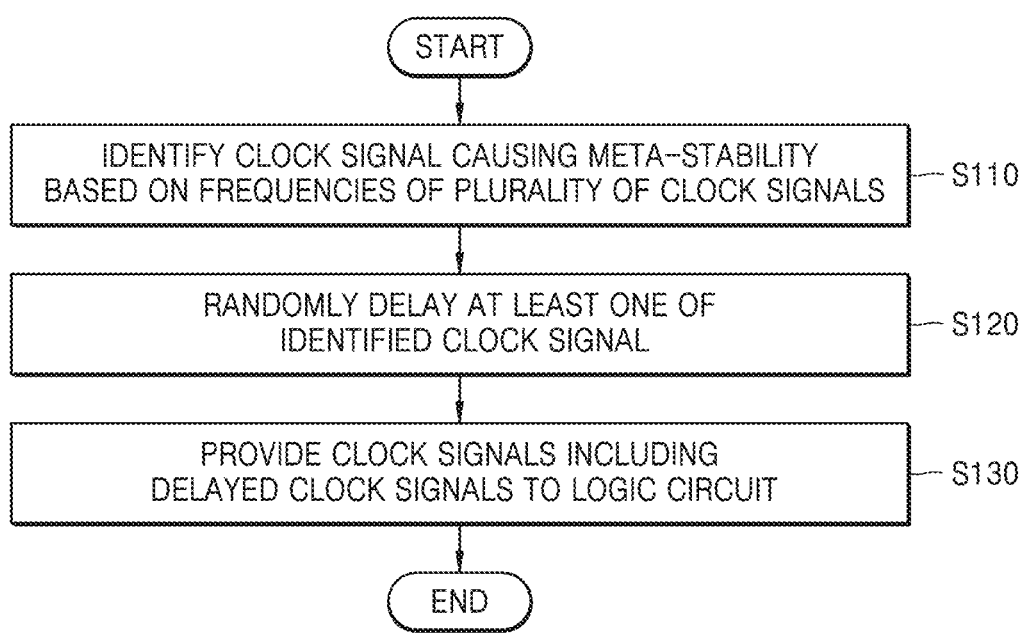
FIG. 9 is a flowchart of a clock controlling method of an integrated circuit, according to some example embodiments.

FIG. 9 is a flowchart of a clock controlling method of the integrated circuit 10, according to some example embodiments.

The integrated circuit 10 may identify the clock signal causing the meta-stability based on the frequencies of the plurality of clock signals (S110). Meta-stability information may include information for identifying the clock signal causing the meta-stability, and may include the frequencies of the plurality of clock signals and the probability that meta-stability occurs, etc.

When data communication between asynchronized clock domains is performed, the meta-stability may occur according to a relationship between a timing when the input signal of the logic clock circuit is transitioned and a setup/hold timing. When the meta-stability occurs, the output signal may not be transitioned to a level of a logical '1' (e.g. a power voltage) or a logical '0' (e.g. a ground voltage), and may be maintained at an intermediate level of the power voltage or be transitioned to the power voltage or the ground voltage in a next cycle.

For example, when a first logic circuit synchronized with a first clock signal communicates with a second logic clock circuit synchronized with a second clock signal, meta-stability may occur. When the frequency of the first clock signal is the same as or an integer multiple of the frequency of the second clock signal, the probability a meta-stability occurs may be further increased.

In this case, clock generators generating a plurality of clock signals including the first clock signal and the second clock signal may generate asynchronized clock signals based on a central clock generated by the PLL. The central clock generator and a local clock generator may set clock frequencies necessary for a logic circuit by using a clock divider.

For example, first, the integrated circuit 10 may identify clock signals sharing the same clock source to identify the meta-stability. The clock source may be the central clock generated by the PLL. The integrated circuit 10 may select clock signals, which have frequency ratios thereof as 1:1 or 1:N, of the selected clock signals.

The integrated circuit 10 may randomly delay at least one of the selected clock signals for solving or reducing the probability of and/or impact of the meta-stability (S120).

For example, to solve or reduce the probability of and/or impact from meta-stability, one of the first clock signal and the second clock signal may be randomly delayed, and both the first clock signal and the second clock signal may also be delayed.

To randomly delay the clock signal, each of the plurality of clock generators may further include a plurality of delay buffers, a random number generator, and the clock delay circuit 230 including the multiplexer 232 selecting the delayed clock signal. The clock delay circuit 230 may select the delay buffer for delaying a clock based on a random number generated by the random number generator.

The random number generator may be or include a circuit such as a hardware random number generator (HRNG) or true random number generator (TRNG) that generates a random number based on physical processes such as with thermal noise, and/or may be or may include a pseudo-random number that algorithmically generates a pseudo-random number (PRG), such as with a linear-feedback shift register (LFSR).

The clock delay circuit 230 may include a buffer chain including a plurality of buffers connected to each other in series. The plurality of delay clock signals may be respectively output from different nodes from each other between buffers included in the clock delay circuit 230. The multiplexer 232 selecting the delayed clock signal may randomly select and output one of the plurality of delay clock signals based on the random number generated by the random number generator.

The clock delay circuit 230 may further include the multiplexer 233 for selecting a mode. For example, the clock delay circuit 230 may operate in a random mode in a general operation of the integrated circuit 10 and provide the random value RANDOM_VALUE, and may provide the set value DELAY_VALUE in the debug mode for debugging.

The integrated circuit 10 may further include a synchronizer including at least one flip-flop for reducing meta-stability from occurring. The synchronizer 240 may constitute or correspond to the sequential circuit by using various logic circuits including the flip-flops and the latches. When the number of flip-flops included in the synchronizer 240 is increased, the probability that meta-stability is transferred to the last flip-flop may be reduced, but the meta-stability may not completely disappear.

The integrated circuit 10 may provide to the logic circuit each of the clock signals including the delayed clock signal.

Any of the elements disclosed above may include and/or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

Example embodiments are not limited to those described above. Furthermore example embodiments described above are not necessarily mutually exclusive. For example, some example embodiments may include some features described with reference to one or more figures, and may also include features described with reference to one or more other figures.

While inventive concepts has been particularly shown and described with reference to some example embodiments thereof, it will be understood that various changes in form and details may be made therein without departing from the spirit and scope of the following claims.

What is claimed is:

1. An integrated circuit comprising:
   a plurality of clock generators configured to respectively generate a plurality of clock signals;
   a plurality of logic circuits configured to operate in synchronization with the plurality of clock signals; and
   controller circuitry configured to identify meta-stability information based on frequencies of the plurality of clock signals, and configured to control at least one of the plurality of clock generators so that the at least one of the plurality of clock signals is randomly delayed in response to the meta-stability information.

2. The integrated circuit of claim 1, wherein the controller circuitry is configured to select clock signals having identical frequencies from the plurality of clock signals, and
   to randomly delay at least one of the selected clock signals.

3. The integrated circuit of claim 1, wherein the plurality of clock signals are asynchronous signals.

4. The integrated circuit of claim 1, further comprising:
   a central clock generator configured to generate a central clock based on a phase-locked loop (PLL),
   wherein each of the plurality of clock generators is configured to generate a respective one of the plurality of clock signals based on the central clock.

5. The integrated circuit of claim 1, further comprising:
   a synchronizer comprising at least one flip-flop, the flip-flop configured to synchronize the plurality of logic circuits based on the meta-stability information.

6. The integrated circuit of claim 1, wherein each of the plurality of clock generators comprises a clock delay circuit configured to randomly delay a respective one of the plurality of clock signals and random number generator circuitry configured to generate a random value, and
   the clock delay circuit comprises a plurality of delay buffers and a multiplexer, the multiplexer configured to select the respective delayed clock signals.

7. The integrated circuit of claim 6, wherein the multiplexer is configured to select any one of the plurality of delayed clock signals provided by the plurality of delay buffers based on the random value generated by the random number generator circuitry.

8. The integrated circuit of claim 1, wherein, in response to a frequency of a first clock signal of the plurality of clock signals synchronizing an input signal of a logic circuit being an integer multiple of a frequency of a second clock signal of the plurality of clock signals synchronizing an output signal of the logic circuit, the controller circuitry is configured to randomly delay at least one of the first clock signal and the second clock signal.

9. The integrated circuit of claim 1, wherein the controller circuitry is configured to generate clocks of identical periods, by applying, to a clock signal from among the plurality of clock signals, a delayed time randomly determined at a start of an operation of generating the clock signal of the clock generator to which a random delay is applied.

10. The integrated circuit of claim 1, wherein the controller circuitry is configured to apply a random delay time or a set delay time to the clock generator to which a random delay is applied.

11. A method performed by an integrated circuit comprising a plurality of clock generators, the method comprising:
    identifying a first clock signal from a plurality of clock signals and a second clock signal from the plurality of clock signals, the first clock signal and the second clock signal causing meta-stability based on frequencies of the plurality of clock signals generated by the plurality of clock generators;
    delaying randomly at least one of the first clock signal and the second clock signal; and
    providing the first clock signal to a first logic circuit and the second clock signal to a second logic circuit,
    wherein the first logic circuit communicates with the second logic circuit in synchronization with the first clock signal, and the second logic circuit communicates with the first logic circuit in synchronization with the second clock signal.

12. The method of claim 11, wherein the identifying of the first clock signal and the second clock signal comprises:
    identifying the first logic circuit and the second logic circuit communicating with each other; and
    when a frequency of the first clock signal is identical to or an integral multiple of a frequency of the second clock signal, determining the meta-stability.

13. The method of claim 11, wherein each of the plurality of clock generators generates an asynchronous clock signal based on a central clock generated by a phase-locked loop (PLL).

14. The method of claim 11, wherein each of the plurality of clock generators comprises a clock delay circuit, a random number generator, and a multiplexer configured to select delayed clock signals, the clock delay circuit including a plurality of delay buffers, and
    the clock delay circuit selects a delay buffer for delaying a clock based on a random number generated by the random number generator.

15. The method of claim 11, wherein the integrated circuit further comprises a synchronizer comprising at least one flip-flop for reducing meta-stability from occurring.

16. A method performed by an integrated circuit comprising a plurality of clock generators, the method comprising:
    identifying a clock generator causing meta-stability in logic circuits that communicate with each other, the identifying based on frequencies of clock signals of each of the plurality of clock generators;
    selecting at least one clock generator, which randomly delays a clock signal, from the identified clock generator; and
    providing a random delay to the logic circuit via the selected at least one clock generator.

17. The method of claim 16, wherein each of the plurality of clock generators comprises a clock delay circuit, random number generator circuitry, and a multiplexer configured to select delayed clock signals, the clock delay circuit including a plurality of delay buffers.

18. The method of claim 17, wherein the clock delay circuit selects a delay buffer for delaying a clock based on a random number generated by the random number generator circuitry.

19. The method of claim 16, wherein the identifying of the clock generator comprises identifying clock generators, in which frequencies of the clock signals are identical to or integer multiples of each other, from the plurality of clock generators.

20. The method of claim 16, wherein the integrated circuit further comprises a synchronizer comprising at least one flip-flop configured to synchronize the logic circuits based on the meta-stability.

\* \* \* \* \*